(12) United States Patent
Wang et al.

(10) Patent No.: US 7,253,626 B2
(45) Date of Patent: Aug. 7, 2007

(54) MULTI-LOOP RECEIVER COIL HAVING A LARGE TUNING RANGE FOR A MAGNETIC RESONANCE IMAGING SYSTEM

(75) Inventors: Jian Min Wang, ShenZhen (CN); Bei Zhang, Anhui (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/156,208

(22) Filed: Jun. 17, 2005

(65) Prior Publication Data

US 2006/0033500 A1   Feb. 16, 2006

(30) Foreign Application Priority Data

Jun. 17, 2004   (CN) .................. 2004 1 0059677

(51) Int. Cl.
*G01V 3/00*   (2006.01)
(52) U.S. Cl. .................................... 324/322
(58) Field of Classification Search ............... 324/307, 324/309, 318, 322
See application file for complete search history.

(56) References Cited

U.S. PATENT DOCUMENTS 5,144,240 A * 9/1992 Mehdizadeh et al. ....... 324/318
5,212,450 A * 5/1993 Murphy-Boesch et al. . 324/322
5,990,681 A * 11/1999 Richard et al. ............. 324/318
6,236,206 B1 * 5/2001 Hartman et al. ............ 324/318
6,316,941 B1 * 11/2001 Fujita et al. ................ 324/318
6,396,271 B1 * 5/2002 Burl et al. .................. 324/318
6,522,143 B1 * 2/2003 Fujita et al. ................ 324/318
6,552,544 B2 * 4/2003 Wong et al. ................ 324/318
6,633,161 B1 * 10/2003 Vaughan, Jr. ............... 324/318

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

A receiver coil loop for a magnetic resonance imaging system has a tuning loop for adjusting a tuning capacitor to make the tuning loop resonate at a center frequency a detuning loop for maintaining the receiver coil loop in a non-working state when the transmitter coil is emitting signals, and a matching loop for matching the tuning loop at the center frequency. The tuning loop and the detuning loop share a capacitor, and the tuning capacitor and the shared capacitor are connected in parallel. In such a receiver coil loop, the value of the tuning capacitor is reduced, the frequency tuning range of the tuning capacitor is broadened; the capacitive reactance generated by the entire circuit is reduced, and the tuning capacitor Ctuning is protected against breakdown under high voltage without increasing the loss of the circuit.

5 Claims, 3 Drawing Sheets

MULTI-LOOP RECEIVER COIL HAVING A LARGE TUNING RANGE FOR A MAGNETIC RESONANCE IMAGING SYSTEM

BACKGROUND OF THE INVENTION

1. Field of the Invention

The present invention relates to a receiver coil loop, in particular to a receiver coil loop for a magnetic resonance imaging system.

2. Description of the Prior Art

Magnetic resonance imaging (MRI) is an imaging modality, wherein the signals generated by nuclear magnetic resonance are reconstructed for imaging. More specifically, the basic principle of magnetic resonance is that: for atomic nuclei with odd numbers of protons, e.g. the hydrogen nucleus that permeates a human body, the positively charged protons thereof generates spinning movements to generate a magnetic moment, serving as a small magnet. The arrangement of the spin axes of these small magnets is normally irregular (random). But in a homogenous strong magnetic field the spin axes of the small magnet will be rearranged depending on the direction of the magnetic field lines. In this state, excited by a radio frequency (RF) pulse at a specific frequency, the hydrogen nucleus, serving as a small magnet, absorbs a certain amount of energy so as to resonate, causing the magnetic resonance phenomenon to occur. Once the transmitting of RF pulses is stopped, the excited hydrogen nucleus will release the absorbed energy gradually, and then the phase and energy level will resume to the state before the excitation. Different from the imaging principle in X ray, CT, etc., MRI causes no radiation harm to human body, and therefore it has provided a broad research field for clinical applications.

A magnetic resonance imaging system basically includes a basic field magnet, a gradient field coil system, an RF coil system, a control unit for executing a sequence, and an image processing and display system. The gradient coil system is employed to modify the main magnetic field, and to generate a gradient magnetic field. The gradient magnetic field provides the possibility for three-dimensional coding of the magnetic resonance signals in the human body for spatial orientation, though the magnetic field strength thereof is only several hundredths of the main magnetic field. The RF coil system includes a transmitter coil and a receiver coil. The transmitter coil transmits pulses into the human with proper RF energy for excitation, serving as a short wave transmitting channel and a transmitting antenna, so the hydrogen nucleus (atomic nucleus with an odd number of protons) within the human body receive the pulse, serving as a radio receiver. After the transmission of the pulses (excitation) is stopped, the hydrogen nucleus within human body serves as a shortwave transmitter, whereas the MR signal receiver serves as a radio receiver to receive magnetic resonance signals. The functions of the magnetic resonance signal receiver are realized by the receiver coils.

The aforementioned receiver coil converts the magnetic signals transmitted from the human body into electrical signals, which are then transferred to the image processing and display system via a cable for further image reconstruction processing. To maximize the signals, the frequency of the received signals should equal to the frequency of the signals transmitted by the atomic nucleus, i.e. resonance should be achieved. For hydrogen atoms (protons) the resonant frequency is 14.6 MHz in a magnetic field of 0.35 T. Since the magnetic field strength of the manufactured basic field magnet has a certain deviation, centered around 0.35 T the resonant frequency of protons also shifts slightly around the resonant frequency.

Thus, in the MRI system, if the receiver coil is to operate properly, the receiver coil must work properly within a frequency band with the resonant frequency (resonance frequency ±100 kHz) at the center. Generally, this object is achieved by discrete circuitry, such as the circuitry described in the document *Siemens Internal Document Part Number: 7100303, 7100394*. The so-called discrete circuitry indicates that the fixed capacitors respectively employed by the tuning loop and the detuning loop are different. In FIG. 1, the fixed capacitors employed by the tuning loop are Cp and Cdetune, whereas the counterpart employed by the detuning loop is Cdetune. The opposite of discrete circuitry is combined circuitry. Combined circuitry indicates that the fixed capacitors employed by the tuning loop and the detuning loop are the same. The theory of the discrete circuitry of the receiver coil can be as illustrated in FIG. 1. As in FIG. 1, three loops are included, which are a tuning loop, a detuning loop and a matching loop, respectively.

In the discrete circuitry in FIG. 1, the detuning loop has an inductor Ls, a diode D, and a detuning capacitor Cdetune. The inductor Ls is connected in series to the diode D, and is connected in parallel with the detuning capacitor Cdetune. The detuning loop is mainly to maintain the receiver coil in a non-working state when the transmitter coil is transmitting signals, i.e., so that the diode D is ON, and the inductor Ls and the detuning capacitor Cdetune are in the resonant state. According to the resonance theory, now the detuning loop disconnects from the external loop; thus, the receiver coil does not work. When the tuning loop works, the diode D is non-conducting, thus the tuning loop is composed of a tuning capacitor Ctuning, the detuning capacitor Cdetune, a load resistance R and the inductors Ls connected in series, and a capacitor Cp further connected in parallel with these components, so as to cause the loop to resonate at the central frequency of the receiver coil, by adjusting the tuning capacitor Ctuning. The tuning capacitor is formed by a fixed capacitor C and an electrolytic capacitor Ctuning' connected in parallel, as shown in FIG. 2. The matching lines may include the tuning capacitor Cs and the tuning loop connected in series, so that the signal transmission is maximized as the signals are prevented from reflecting within the tuning loop, when the frequency of the tuning loop matches the central frequency of the receiver coil. These three loops cooperate to fulfill the requirements for the receiver coil to produce resonance within an acceptable resonant frequency range.

In the resonant state, the detuning capacitor Cdetune and the tuning capacitor Ctuning of the discrete circuitry hold respective portions of the inductive reactance. In other words, the inductor L, the detuning capacitor Cdetune, the tuning capacitor Ctuning, and the capacitor Cp are formed into an LC loop. The LC loop satisfies $\omega\sqrt{LC}=1$, wherein $\omega$ is the angular velocity at the center frequency, L is inductance. Both are constant values; therefore the total capacitive reactance C of the tuning circuit is also a constant value. Since the total capacitive reactance C is formed by Cdetune, Ctuning, and Cp connected in series, and the capacitive reactance has a tendency of being decreased as additional items enter into the serial connection, the capacitances of the tuning capacitor Ctuning, the detuning capacitor Cdetune, and the capacitor Cp are all greater than the total capacitive reactance C. In addition, since the detuning capacitor Cdetune holds a portion of the inductive reactance, the inductive reactance assigned to the tuning capacitor Ctuning is reduced, resulting in an increased capacitance value for the tuning capacitor Ctuning. In the tuning loop, a value of the tuning capacitance Ctuning that is too large may lead to a smaller tuning range, and since the field strength of the basic field magnet cannot be precisely 0.35 T (due to manufacturing tolerances), the resonant frequency may be slightly altered. Each receiver coil loop must be adjusted individually, i.e., it is necessary to choose and adjust a tuning capacitor Ctuning so that the receiver coil works properly within a frequency band with the resonant frequency at the center, which leads to a rather low production efficiency for the current receiver coil.

The prior art has attempted to employ the method shown in FIG. 3, to reduce the inductive reactance held by the detuning capacitor Cdetune. In the detuning state, when the diode is ON, the capacitor C' is disabled, thus the detuning circuit is the same as that shown in FIG. 1. However, in the tuning state, Ls is in effect connected in series to C', and then further connected in parallel with Cdetune. The parallel connection between the capacitors C' and Cdetune increases the capacitance of the detuning loop, and reduces the inductive reactance thereof. Since the inductive reactance held by the tuning capacitor Ctuning is increased, the capacitance value thereof may be reduced, and thereby the tuning range is broadened to a certain extent. However, it still cannot meet the requirements for a large-scale tuning, and the loss of the circuitry is increased, since Ls is still working during tuning.

SUMMARY OF THE INVENTION

An object of the present invention is to provide a receiver coil loop for a magnetic resonance imaging system that includes a tuning loop, a detuning loop, and a matching loop, and that overcomes the disadvantage of a tuning range that is small due to the capacitive reactance being too large, as in conventional tuning circuits, and thus wherein the tuning range of the tuning circuit is enlarged. Therefore, rather than by tuning the coils according to the particular magnetic field strength of each basic field magnet during the manufacturing process, the receiver coil loops with the same specifications can be produced in batches, to meet the requirements of basic field magnets with different magnetic field strengths, without increasing the loss of the circuitry.

This object is achieved in accordance with the invention by a receiver coil loop for a magnetic resonance imaging system, for receiving magnetic signals emitted from the human body after excitation by a transmitter coil, having a tuning loop for adjusting a tuning capacitor to make the tuning loop resonate at a center frequency a detuning loop for maintaining said receiver coil loop in a non-working state when the transmitter coil is emitting signals, a matching loop for matching said tuning loop at the center frequency, with the tuning loop and the detuning loop sharing a capacitor, and the tuning capacitor and the shared capacitor being connected in parallel.

In an embodiment of the present invention, the receiver coil loop of the magnetic resonance imaging system has an inductor Ls, a tuning capacitor Ctuning, a diode D, a capacitor Cp, an inductor L and a load resistance R, and a tuning capacitor Cs'. The inductor L and the load resistance R are connected in series, and are connected to the capacitor Cp in parallel. The thus-formed loop is connected to the inductor Ls in series, and is connected to the capacitor Ctuning in parallel, and is connected to the capacitor Cs' in series. The terminals of the diode D are connected to the inductor Ls and the capacitor Cp, so that it is conductive during the detuning state to cause the inductor Ls and the capacitor Cp to resonate, so that the entire coil does not operate.

In another embodiment of the present invention, the tuning loop of the magnetic resonance imaging system receiver coil includes the inductor Ls, the tuning capacitor Ctuning, the capacitor Cp, the inductor L and the load resistance R. The inductor L and the load resistance R are connected in series and are connected to the capacitor Cp in parallel. The loop thus-formed is connected to the inductor Ls in series and is connected to the capacitor Ctuning in parallel.

In a further embodiment of the present invention, the detuning loop of the magnetic resonance imaging system receiver loop includes the inductor Ls, the diode D, and the capacitor Cp, the diode D is conductive during the detuning state, and the inductor Ls is connected to the capacitor Cp in parallel.

In another embodiment of the present invention, the matching loop of the magnetic resonance imaging system receiver coil includes the inductor Ls, the tuning capacitor Ctuning, the capacitor Cp, the inductor L, the load resistance R, and the tuning capacitor Cs'; the inductor L is connected to the load resistance R in series and is connected to the capacitor Cp in parallel. The loop thus-formed is connected to the inductor Ls in series and is connected to the capacitor Ctuning in parallel, and is connected to the capacitor Cs' in series.

The loop of the present invention has the following advantages compared to the prior art: (1) The value of the tuning capacitor Ctuning is reduced, so the frequency tuning range of the tuning capacitor is thereby broadened. Thus, coils with the same specifications can be produced in batches to meet the requirements of basic field magnets with different magnetic field strengths, without tuning the coils according to the frequency of each basic field magnet. (2) In discrete circuitry, Cs is connected in series to the external loop (via the tuning capacitor Ctuning, the capacitor Cp, the inductor L, and the load resistance R). When the detuning loop is operable, the loop is disconnected due to resonance, so that Cp and Cs form a loop; whereas in accordance with the invention, the resonance of Ls and Cp leaves only Cs' connected in series to Ctuning in the loop. The capacitive reactance generated by the whole circuit is reduced, because Cs' is smaller than Cs, and Ctuning is smaller than Cp. (3) During the emission of signals, the detuning loop is in the operate state, one terminal of Ctuning is grounded, and the opposite terminal of Ctuning is also grounded since the diode is conductive; therefore, the tuning capacitor Ctuning is protected against breakdown under high voltage.

DESCRIPTION OF THE PREFERRED EMBODIMENTS

Figure 4:
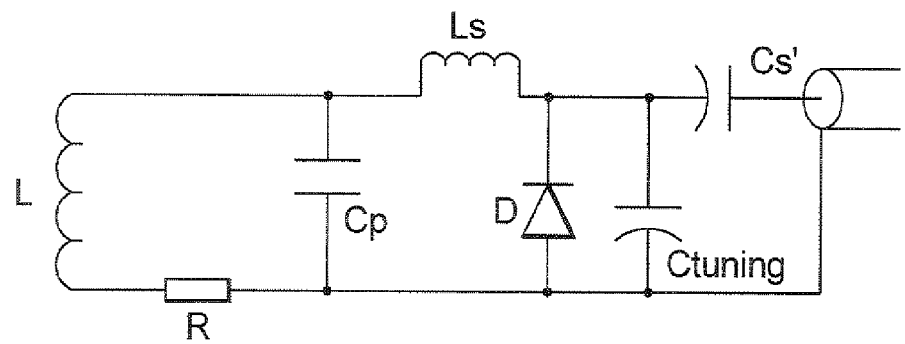
FIG. 4 is a circuit diagram of the magnetic resonance imaging system receiver coil loop according to the present invention, formed by combining a matching loop, a tuning loop and a detuning loop.

FIG. 4 shows an embodiment of a receiver coil Loop of magnetic resonance imaging system of the present invention. The receiver coil loop has an inductor Ls, a tuning capacitor Ctuning, a diode D, a capacitor Cp, an inductor L a load resistance R, and a tuning capacitor Cs'. The load resistance R is generally a patient. The inductor L and the load resistance R are connected to in series, and are connected to the capacitor Cp in parallel. The loop thus-formed is connected to the inductor Ls in series and to the tuning capacitor Ctuning in parallel, and to the capacitor Cs' in series. The terminals of the diode D are respectively connected to the inductor Ls and the capacitor Cp, so that it is conductive during the detuning state to cause the inductor Ls and the capacitor Cp to resonate; therefore the entire coil does not operate.

The magnetic resonance imaging system receiver coil loop in FIG. 4 is formed by combining the following three components: a tuning loop, a detuning loop, and a matching loop, wherein the tuning loop includes the inductor Ls, the tuning capacitor Ctuning, the capacitor Cp, the inductor L, and the load resistance R. The inductor L and the load resistance R are connected in series, and are connected to the capacitor Cp in parallel. The loop thus-formed is connected to the inductor Ls in series, and to the capacitor Ctuning in parallel. The detuning loop includes the inductor Ls, the diode D and the capacitor Cp. The diode D is conductive during the detuning state, and the inductor Ls and the capacitor Cp are connected in parallel. The tuning loop and the detuning loop share the capacitor Cp. The matching loop includes the inductor Ls, the tuning capacitor Ctuning, the capacitor Cp, the inductor L and the load resistance R, and the tuning capacitor Cs'. The inductor L and the load resistance R are connected in series, and are connected to the capacitor Cp in parallel. The loop thus-formed is connected to the inductor Ls in series, and to the capacitor Ctuning in parallel, and to the capacitor Cs' in series.

The receiver coil loop of the present invention is formed by the combination of the tuning loop, the detuning loop, and the matching loop. This arrangement greatly reduces the values of the tuning capacitor Ctuning and Cs', and the tuning range is accordingly substantially broadened. This can be proved by calculation.

Figure 5:
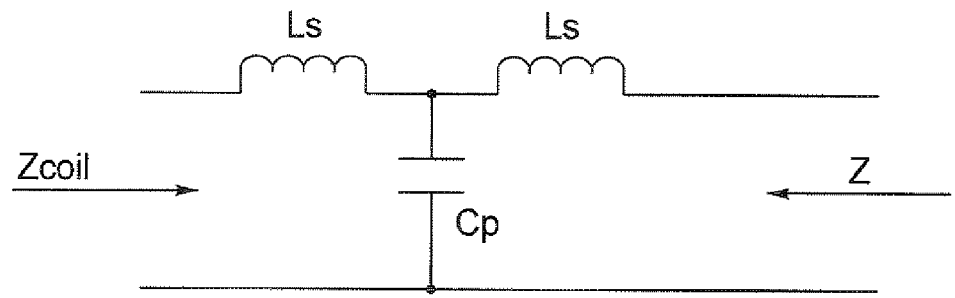
FIG. 5 is an equivalent circuit diagram of the tuning loop of the magnetic resonance imaging system receiver coil loop according to the present invention, wherein the tuning capacitor Ctuning is not present.
Figure 6:
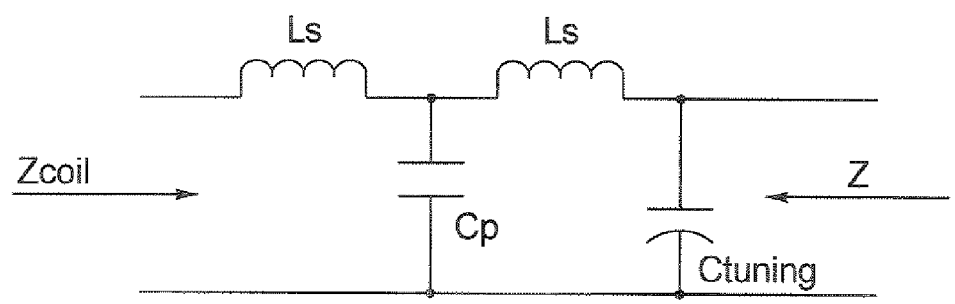
FIG. 6 is an equivalent circuit diagram of the tuning loop of the magnetic resonance imaging system receiver coil loop according to the present invention, wherein the tuning capacitor Ctuning is present.

The tuning capacitor Cs' of FIG. 4 is used for maximizing the transmission for the tuning loop at the resonant frequency, so as to achieve the matching effect. In case of matching, the tuning circuit may be regarded as a λ/4 circuit; the equivalent circuit thereof has forms as shown in FIG. 5 and FIG. 6. FIG. 5 is the equivalent circuit of the tuning loop without the tuning capacitor Ctuning, and FIG. 6 is the equivalent circuit with the tuning capacitor Ctuning.

Figure 1:
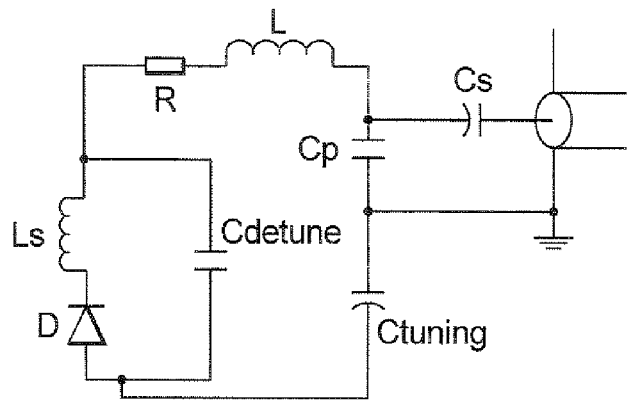
FIG. 1 is a circuit diagram of a magnetic resonance imaging system receiver coil loop in the prior art formed by a discrete matching loop, tuning loop, and detuning loop, as explained above.
Figure 2:
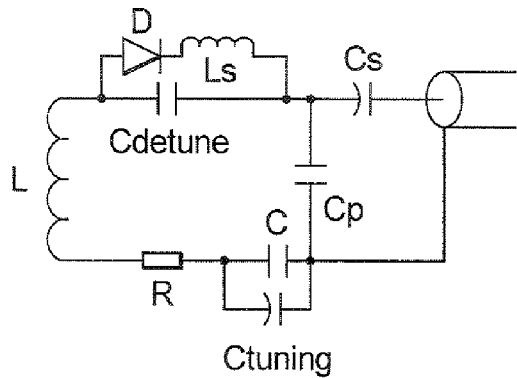
FIG. 2 is an equivalent circuit diagram illustrating the receiver coil loop in FIG. 1, as explained above.
Figure 3:
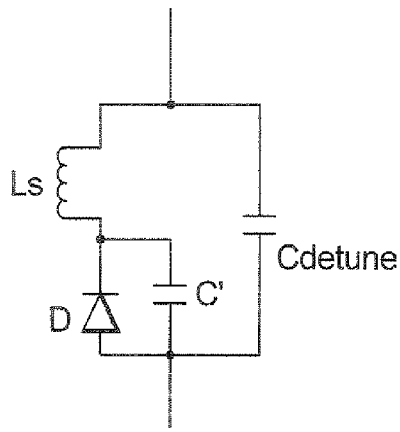
FIG. 3 is a circuit diagram illustrating the solutions for offsetting the inductive reactance held by the detuning loop in FIG. 1 in the prior art, as explained above.

In the present invention for the matching loop, the following conditions are assumed for comparison: Only the right portion of the capacitor Cp in FIG. 1 and the right portion of the capacitor Cp in FIG. 5 and FIG. 6 of the present invention are taken into account, and the impedances of the two parts should be equal. Thus, an impedance formula (1) is as follows:

$$\frac{1}{j\omega Cs} = j\omega Ls + \frac{1}{j\omega Cs'} \quad (1)$$

wherein Cs is the matching capacitance of FIG. 1. From the formula (1), it can be seen that the value of the tuning capacitor Cs' in the receiver loop of the present invention is smaller than that of the tuning capacitor Cs in the prior art.

In the present invention, the detuning loop is a resonant circuit, with the oscillating condition of $\omega\sqrt{LC}=1$. Thus, formula (2) is derived:

$$\omega^2 LC = 1 \quad (2)$$

The equivalent circuits of the tuning loop of the present invention are as shown in FIG. 5 and FIG. 6. As seen from the input direction (the left side of FIG. 4), the impedance of the entire tuning loop is Zcoil; whereas from the output direction (the right side of FIG. 4), the impedance of the entire loop is Z. The characteristic impedance of the transmission line between the two is $Z_L$. The impedance seen from the input, output directions in high frequency circuitry equals to the square of the characteristic impedance of the transmission lines, thus, Z and Zcoil in FIG. 5 satisfy the formula (3) as follows:

$$Z_L^2 = Z * Zcoil \quad (3)$$

Thus, formula (4) is derived:

$$Z = \frac{Z_L^2}{Zcoil} \quad (4)$$

Based on electromagnetic theory, for high frequency circuitry, the characteristic impedance $Z_L$ of the transmission lines can be represented by:

$$z_L = \sqrt{\frac{L_s}{C_P}} \quad (5)$$

Figure 7:
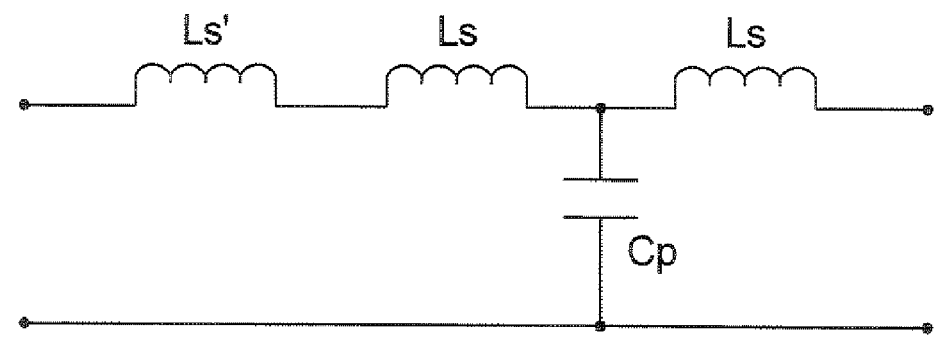
FIG. 7 is a circuit diagram of the tuning loop of the magnetic resonance imaging system receiver coil loop according to the present invention wherein the serial connection of an inductor Ls' is equivalent to the parallel connection of the tuning capacitor Ctuning in FIG. 6.

As shown in FIG. 6, in the equivalent circuit of the tuning loop, the parallel connection of a tuning capacitor Ctuning is equivalent to a serial connection of an inductor. Therefore, the circuit in FIG. 6 can be further represented as the equivalent to that shown in FIG. 7. Thus, the formula (4) can be converted into:

$$Z = \frac{Z_L^2}{Zcoil + j\omega L'} \quad (6)$$

In formula (6), the inductor satisfies:

$$L' = Ls\frac{Ctuning}{Cp} \quad (7)$$

Based on the above deduction, hereinafter, specific values will be brought into the formulae to calculate the value of the tuning capacitor Ctuning and the tuning frequency range in the prior art and in the present invention, and a comparison is made between them. It is assumed that the resonant frequency is 14.6 MHz (corresponding to the resonant frequency of hydrogen protons in the magnetic field of 0.35 T) and ω is 2π*14.6 MHz, the inductive reactance value L of the total tuning loop is 800 nH, the value of the capacitor Cp is 330 pF, the value of the detuning capacitor Cdetune is 470 pF, and the value of the fixed capacitance C constituting the tuning capacitance Ctuning is 470 pF. As for the tuning loop of the discrete circuitry of FIG. 1, since the three capacitors Cp, Cdetune, and Ctuning are connected in series, the following formula can be derived from the formula of resonance conditions (2):

$$\frac{1}{Cp} + \frac{1}{Cdetune} + \frac{1}{Ctuning} = \omega^2 L$$

Thereby, $Ctuning = \dfrac{1}{\omega^2 \cdot L - \dfrac{1}{Cdetune} - \dfrac{1}{Cp}}$ The above-mentioned known values are brought into the formula, and a value of the tuning capacitor Ctuning of 635.2 pF is calculated during resonance. If the value of the tuning capacitor Ctuning is adjusted to increase by 1 pF, the values for other capacitors and inductors are brought into the formula, thus a new resonance frequency can be calculated from the formula shown below:

$$\omega 1 = \left(\frac{\frac{1}{Cp} + \frac{1}{Cdetune} + \frac{1}{Ctuning + 1}}{L}\right)^{0.5}$$

whereby, the resonant frequency f=ω1/2π, which changes from 14.6 MHz into 14.597 MHz. In other words, if the tuning capacitor Ctuning is adjusted to increase by e.g. 1 pF, the corresponding resonant frequency change is 3 KHz.

Figure 8:
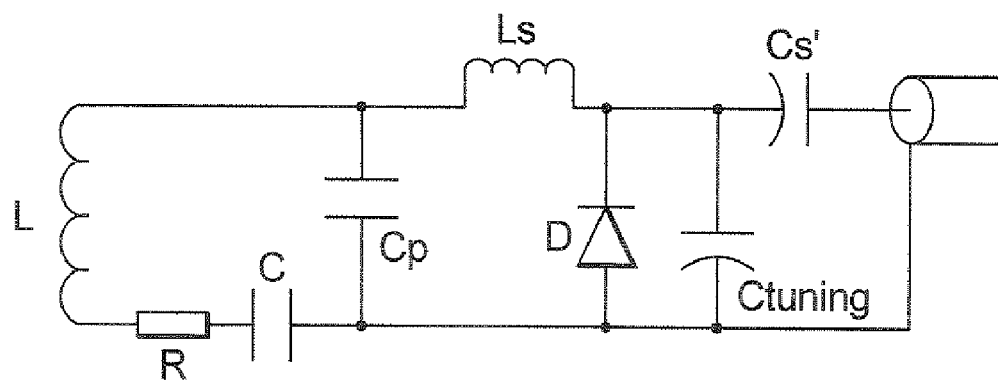
FIG. 8 is a circuit diagram of the combined circuitry of the receiver coil loop, resulting from FIG. 4 with the addition of a detuning capacitor Cdetune and a fixed capacitor C, for comparison with the known circuit of FIG. 1 under the same conditions.

As for the detuning loop of the combined circuitry of the present invention shown in FIG. 4 and FIG. 8, the same L and ω values are employed for the capacitors and the inductors. The inductor Ls is calculated as 360 nH, based on the formula of resonance conditions (2)

$$Ls = \frac{1}{\omega^2 Cp}$$

To compare with FIG. 1 under the same conditions, a detuning capacitor Cdetune and a fixed capacitor C are assumed to be added in FIG. 4, and FIG. 8 is the circuit diagram after the addition of the two capacitors. In FIG. 8, since two capacitors are connected in series in the branch circuit of the inductor L in FIG. 4, the inductive reactance held by the capacitors connected in series is increased, and the inductive reactance held by the tuning capacitor Ctuning is reduced accordingly. Thus, the value of the tuning capacitor Ctuning is increased. In FIG. 8, the inductor L, the detuning capacitor Cdetune, and the fixed capacitor C are connected to in series, and further connected to the capacitor Cp in parallel, and then connected in parallel with the serial loop formed by the serially connected tuning capacitor Ctuning and inductor Ls. Seen from FIG. 8, the inductor L is connected to the detuning capacitor Cdetune, and the fixed capacitor C in series, with the corresponding impedance expression of $$j \cdot \omega \cdot L + \frac{1}{j \cdot \omega \cdot \frac{Cdetune \cdot C}{Cdetune + C}}$$

The values for the detuning capacitor Cdetune and the fixed capacitor C both have been assumed to be 470 as above described, and brought into the above formula; and then connected to the capacitor Cp in parallel; thus, the resulting impedance after the parallel connection is:

$$\frac{\left(j \cdot \omega \cdot L + \dfrac{1}{j \cdot \omega \cdot 235}\right) \cdot \dfrac{1}{j \cdot \omega \cdot Cp}}{j \cdot \omega \cdot L + \dfrac{1}{j \cdot \omega \cdot 235} + \dfrac{1}{j \cdot \omega \cdot Cp}}$$

The impedance for the serial loop formed by the tuning capacitor Ctuning and the inductor Ls is:

$$\frac{1}{j \cdot \omega \cdot Ctuning} + j \cdot \omega \cdot Ls$$

In case the LC tuning loop is in resonance, the sum of the impedance from each portion is up to zero when the tuning loop is regarded as in a serial connection.

$$\frac{\left(j \cdot \omega \cdot L + \dfrac{1}{j \cdot \omega \cdot 235}\right) \cdot \dfrac{1}{j \cdot \omega \cdot Cp}}{j \cdot \omega \cdot L + \dfrac{1}{j \cdot \omega \cdot 235} + \dfrac{1}{j \cdot \omega \cdot Cp}} + \frac{1}{j \cdot \omega \cdot Ctuning} + j \cdot \omega \cdot Ls = 0$$

Thus; the following formula is derived:

$$\frac{1}{\omega \cdot Ctuning} = \frac{\left(-\omega \cdot L + \dfrac{1}{\omega \cdot 235}\right) \cdot \dfrac{1}{\omega \cdot Cp}}{\omega \cdot L - \dfrac{1}{\omega \cdot 235} - \dfrac{1}{\omega \cdot Cp}} + \omega \cdot Ls$$

Since $\omega^2 \cdot Ls \cdot Cp = 1$ in the detuning loop of the combined circuitry, thus, $$\frac{1}{\omega \cdot Ctuning} = \omega \cdot Ls \cdot \left(1 + \frac{\frac{1}{\omega \cdot 235} - \omega \cdot L}{\omega \cdot L - \frac{1}{\omega \cdot 235} - \frac{1}{\omega \cdot Cp}}\right)$$

$$\frac{1}{\omega \cdot Ctuning} = \omega \cdot Ls \cdot \left[\frac{1}{Cp \cdot \left(\frac{1}{235} + \frac{1}{Cp} - \omega^2 \cdot L\right)}\right] \text{ wherein,}$$

$$C1 = \frac{1}{235} + \frac{1}{Cp} - \omega^2 \cdot L$$

That is, C1 in the above formula can be regarded as the equivalent capacitance value of the serially connected circuit formed by the inductor L and two capacitors C of 470 pF in FIG. 8, thus, the following formula can be derived as:

$$Ctuning = \frac{C1 \cdot Cp}{\omega^2 \cdot Ls}$$

Bringing the same values as used for calculating in FIG. 1 into the above formula, the tuning capacitor Ctuning turns out to be 60.3 pF, when the receiver coil loop is resonant at 14.6 MHz. The value of the tuning capacitor Ctuning is again increased by e.g. 1 pF to 61.3 pF. From the above relation, the resonant frequency $\omega 2$ can be calculated as:

$$\omega^2 = \left(\frac{\frac{1}{235} + \frac{1}{Cp}}{L + Ls \cdot \frac{Ctuning + 1}{Cp}}\right)^{0.5}$$

The resonant frequency f shifts from 14.6 MHz to 14.591 MHz, with a change of 9 kHz. From the above calculation results, it is apparent that in the receiver coil loop according to the present invention, the value of the tuning capacitor Ctuning is only one tenth of that in the prior art, and each time the tuning capacitor Ctuning is adjusted by 1 pF, the resonance frequency f undergo a change of 9 KHz, which equals to three times of the frequency tuning range in the prior art under the same conditions.

To facilitate the comparison with FIG. 1, the negative factors C and Cdetune are added in FIG. 8 based on FIG. 4, but, the calculation results for FIG. 8 still are much preferred than that of the prior art. When the loop of the present invention as shown in FIG. 4 is employed, the value of the tuning capacitor Ctuning is further reduced with respect to that of FIG. 8 due to the absence of the negative factors C and Cdetune, and the frequency tuning range of the tuning capacitor is further widened accordingly. Thus the receiver coils of the same specification can be produced in batches. Although the magnetic field strengths of different field magnets are different, the receiver coil loop of the present invention still can meet the requirements for resonance due to the adequate tuning range.

Although modifications and changes may be suggested by those skilled in the art, it is the intention of the inventors to embody within the patent warranted hereon all changes and modifications as reasonably and properly come within the scope of their contribution to the art.

We claim as our invention:

1. A receiver coil loop for a magnetic resonance imaging system, for receiving magnetic signals emitted from a subject after of the excitation of the subject by a transmitter coil, comprising:

a tuning loop for adjusting a tuning capacitor to make said tuning loop resonate at a center frequency;

a detuning loop, different from said tuning loop, for maintaining said receiver coil loop in a non-working state when said transmitter coil is emitting signals;

a matching loop, different from said tunina loop and said detuning loop, for matching said tuning loop at the center frequency; and said tuning loop and said detuning loop sharing a capacitor and said tuning capacitor and the shared capacitor being connected in parallel.

2. A receiver coil loop as claimed in claim 1 comprising an inductor Ls, a diode, a capacitor, an inductor L and a load resistance, and a further tuning capacitor Cs', said inductor L and said load resistance being connected in series and connected to said capacitor Cp in parallel forming a loop connected to the inductor Ls in series and connected to the capacitor Ctuning in parallel, and connected to the capacitor Cs' in series, said diode having terminals respectively connected to said inductor Ls and said capacitor Cp, so that said diode is conductive during a detuning state to cause said inductor Ls and said capacitor Cp to resonate, thereby making said receiver coil loop inoperative.

3. A receiver coil loop as claimed in claim 2, wherein said tuning loop comprises said inductor Ls, said tuning capacitor Ctuning, said capacitor Cp, said inductor L and said load resistance, said inductor L and said load resistance being connected in series, and connected to said capacitor Cp in parallel to form a loop connected to said inductor Ls in series, and connected to said capacitor Ctuning in parallel.

4. A receiver coil loop as claimed in claim 2 wherein said detuning loop comprises said inductor Ls, said diode, and said capacitor Cp, said diode being conductive during the detuning state, and said inductor Ls being connected to said capacitor Cp in parallel.

5. A receiver coil loop as claimed in claim 2 wherein said matching loop comprises said inductor Ls, said tuning capacitor Ctuning, said capacitor Cp, said inductor L, said load resistance, and said tuning capacitor Cs', said inductor L being connected to said load resistance in series, and connected to said capacitor Cp in parallel to form a loop connected to said inductor Ls in series and connected to said capacitor Ctuning in parallel, and connected to said capacitor Cs' in series.

\* \* \* \* \*